United States Patent [19]

Takahashi et al.

[11] Patent Number: 5,477,145
[45] Date of Patent: Dec. 19, 1995

[54] RF PROBE

[75] Inventors: Tetsuhiko Takahashi, Soka; Yoshikuni Matsunaga, Kashiwa; Etsuji Yamamoto, Akishima, all of Japan

[73] Assignee: Hitachi Medical Corporation, Tokyo, Japan

[21] Appl. No.: 177,393

[22] Filed: Jan. 5, 1994

[30] Foreign Application Priority Data

Jan. 14, 1993 [JP] Japan .................................. 5-004683

[51] Int. Cl.⁶ .................................................. G01V 3/00
[52] U.S. Cl. ............................................ 324/318; 324/322
[58] Field of Search ........................... 324/318, 322, 324/307, 309, 314; 128/653.5

[56] References Cited

U.S. PATENT DOCUMENTS 5,091,708 2/1992 Bezjak ................................. 324/318
5,198,768 3/1993 Keren .................................. 324/318

Primary Examiner—Louis M. Arana
Attorney, Agent, or Firm—Antonelli, Terry, Stout & Kraus

[57] ABSTRACT

In an RF probe comprising a resonator and a pickup coil, the pickup coil is an 8-shaped coil, and a center portion of this pickup coil is constituted in such a manner that crossing coils become parallel to each other at the portion. The center portion where the coils of the pickup coil are parallel to each other is so disposed as to extend along, and in the vicinity of, a part of a conductor loop of the resonator.

15 Claims, 4 Drawing Sheets

RF PROBE

BACKGROUND OF THE INVENTION

This invention relates to an RF probe of a magnetic resonance imaging (MRI) apparatus.

A cross system RF probe using separate transmission and reception coils has ordinarily been used as an RF transmission/reception system for MRI. This is the system which uses exclusive RF coils for RF magnetic field transmission and MR signal reception, respectively. A saddle coil, a slotted tube resonator (hereinafter abbreviated to "STR"), a multiple element resonator (MER; sometimes referred to also as "birdcage resonator"), etc., are used for the transmission coil. A surface coil is used for ultra-high speed imaging of the heart. The STR and the MER are used as the reception coil for imaging the head, and a round coil is used for imaging the spine and a local part. In order to allow the reception coil to stably operate, an inductive coupling system using a pickup coil (PUC) for RF reception is used in a high magnetic field MRI apparatus of 1.5 T, for example. A QD system is used to improve a reception sensitivity, as described, for example, in JP-A-4-17837. The birdcage resonator is described, for example, in JP-A-61-95234 and JP-A-60-132547.

FIG. 1A of the accompanying drawings illustrates the structure of a cross system RF probe according to the prior art. Reference numerals 101 denotes a transmission coil and reference numeral 100 does a reception coil. The reception coil comprises a resonator 6 and a pickup coil (PUC) 103.

When the transmission coil 101 generates a strong RF magnetic field 102 as shown in FIG. 1A, an induction current 105 flows through the reception coil 100. In the RF probe according to the prior art, the RF magnetic field is offset by this induction current 105 and heterogeneity occurs in the RF magnetic field, so that image quality of the MRI image deteriorates. To prevent this problem, a decoupling circuit using a diode is employed for the resonator 6 and the PUC 103. The decoupling circuit 104 shown in FIG. 1A is such an example. More definitely, the decoupling circuit comprises a cross diode pair 106 or a trap circuit including diodes shown in FIG. 1B.

Recently, however, a sequence for obtaining a high quality image at a high speed by applying a strong RF magnetic field of about 15 KW, for example, has gained a wide application, and an instantaneous current value flowing through the decoupling circuit 104 becomes great. Accordingly, a selection standard for the diodes 106 used for the decoupling circuit 104 has become more severe. Under such a circumstance, the problem has often arisen in that diode characteristics deteriorate with the passage of time and the MRI image deteriorates as well. In the inductive coupling system, in particular, elimination of the induction current 105 of the PUC 103 is important. However, if a decoupling circuit 104 having a large power capacity is connected to eliminate the induction current, a signal-to-noise ratio (S/N) drops.

SUMMARY OF THE INVENTION

To solve the problems with the prior art described above, the present invention aims at providing an inductive coupling type RF probe suitable for a cross system in an RF probe for MRI.

A characterizing feature of the RF probe according to the present invention resides in that a pickup coil connected in inductive coupling with a resonator has an 8-shape so as to reduce an induction voltage generated by an external magnetic field. The resonator is a multiple element resonator, and the pickup coil is disposed in the proximity of a ring of this multiple element resonator. The pickup coil constitutes an LC resonance system and connects a decoupling circuit.

In the RF probe according to the present invention, when a reception coil of a second RF coil is detected by the use of an 8-shaped pickup coil through inductive coupling with respect to a first RF coil for transmission and the second RF coil for reception, an arrangement can be made in such a manner that an induction current is not generated for the magnetic field generated by the first RF coil but is generated for only the magnetic field by the MR signal received by the second RF coil. Accordingly, this induction current does not flow through the pickup coil during RF transmission. In other words, a decoupling device becomes unnecessary. Even when the induction current does not become completely zero, the magnitude of the induction current becomes smaller than in the prior art. Accordingly, a selection standard for the decoupling device becomes looser and design freedom of the RF coil can be improved.

Since the induction current does not flow, the resulting magnetic field is not disturbed, and quality of MRI can be improved.

DESCRIPTION OF THE PREFERRED EMBODIMENTS

Figure 2:
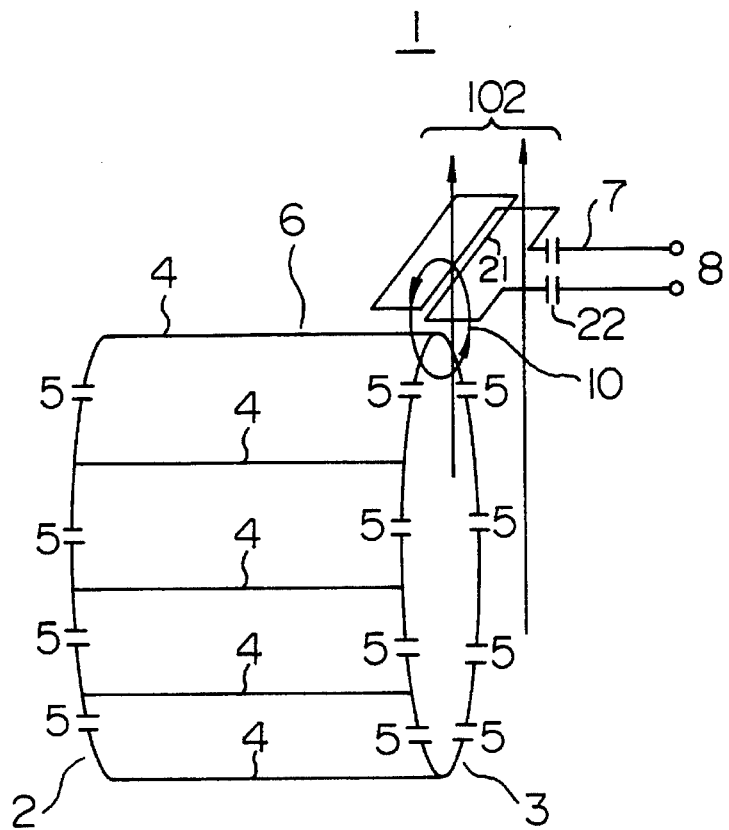
FIG. 2 is a perspective view showing an RF probe according to an embodiment of the present invention.

A preferred embodiment of the present invention will now be described with reference to FIG. 2. This drawing is a perspective view showing a reception coil 1 having a suitable shape for the present invention. A resonator 6 is a multiple element resonator (MER). The MER generally comprises a pair of conductor loops 2 and 3 spaced apart from each other along a common axis, a plurality of axial direction conductor segments (rungs) 4 for electrically connecting the conductor loops with one another and a plurality of capacitance devices 5 disposed on either the conductor loops or on the segments. This embodiment uses a high-pass type resonator having the capacitance devices disposed on the conductor loops. Feed/reception of the resonator 6 is effected by inductive coupling through a pickup coil (PUC) and is given from a port 8.

Next, a definite shape of the resonator 6 will be described. The reception coil for the head, for example, has a diameter of 300 mm, a length of 300 mm and the number of segments of 8, 12 or 16. The drawing shows the case where the number of segments is 8 (with the proviso that a part of the segments is omitted). The conductor loops 2, 3 and the segment 4 are constituted by a copper pipe having a diameter of 3 mm. The electrostatic capacity of the capacitance devices 5 is approximately 30 pF. The resonant frequency of the coil, as viewed from the port 8 of the pickup coil 7, can be regulated by finely adjusting the capacitance of the capacitor of the resonator 6, and is adjusted to a desired MRI frequency such as 63.8 MHz in the case of 1.5 T, for example. The impedance as viewed from the port 8 can be easily adjusted to a desired value such as 50 Ω, for example, by changing and regulating the relative positions between the PUC 7 and the resonator 6 so as to adjust their magnetic coupling state.

Figure 3:
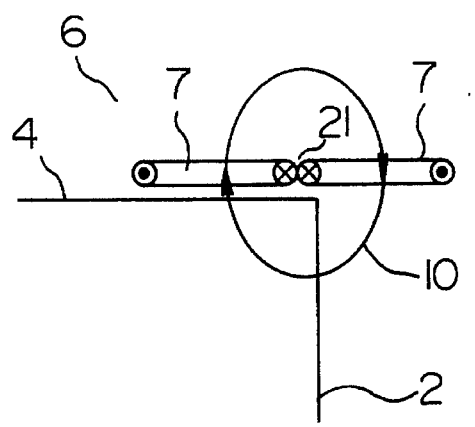
FIG. 3 is a perspective view showing the relationship between a pickup coil and an RF coil of the RF probe according to the present invention.

Next, the PUC 7 will be explained. The PUC 7 has an 8-shape, and the portion corresponding to the crossing center portion of the 8-shape is constituted in such a manner that coils become parallel to one another. The center parallel portions 21 of the coils are so disposed as to extend along, and in the proximity of, the conductor loops of the resonator 6 (see FIG. 3).

Generally, the resonator 6 generates a homogeneous magnetic field at the center portion of the segments 4 but generates a round magnetic field 10 round the conductor loops in the vicinity of the conductor loops 2, 3. Accordingly, this round magnetic field 10 acts on this 8-shaped PUC 7 and an induction current develops in the PUC 7. In consequence, magnetic coupling is efficiently effected between the resonator 6 and the PUC 7, and inductive coupling reception becomes possible.

Next, the state where magnetic coupling between a transmission coil and a reception coil is eliminated will be explained. Generally, the magnetic field generated by the transmission coil is homogeneous in a broader range than the magnetic field generated by the reception coil. Accordingly, a homogeneous RF magnetic field 102 penetrates through the PUC 7 as shown in FIG. 2. This RF magnetic field 102 induces an induction current in the PUC 7. However, since the induction current flows in opposite directions through the two loops in the 8-shaped PUC 7, the induction current becomes zero as the sum. In other words, the transmission coil and the PUC 7 do not couple magnetically with each other. Accordingly, a decoupling device is not necessary for the pickup coil 7. Even when the induction current does not become completely zero due to the difference of the sizes of the two 8-shaped loops and so forth, the degree of the induction current itself becomes smaller than in the prior art devices. In other words, since a selection standard for the decoupling device inserted into the PUC 7 becomes looser, design freedom of the reception coil can be improved. Incidentally, the induction current of the resonator 6 can be eliminated by a known decoupling circuit (not shown in the drawing).

A typical PUC has a size such that one portion of the 8-shape is 40 mm×125 mm. The PUC is constituted by a copper pipe having a diameter of 3 mm. To allow the PUC 7 to stably operate, a suitable capacitor 22 is preferably connected in series with the PUC so that the PUC operates as an LC series resonance type coil the resonance frequency of which substantially coincides with the resonance frequency of the resonator. One, or both, of the 8-shaped loops may be multiplexed. In this way, greater coupling can be obtained in a smaller size. The decoupling circuit which is inserted into the PUC, whenever necessary, can be constituted by a known system such as diodes by external current control, a trap circuit, a cross-diode circuit, and so forth.

Figure 4A:
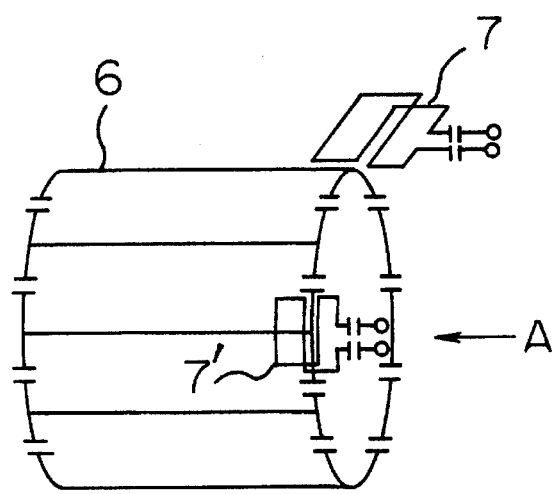
FIG. 4A is a perspective view showing the RF probe according to another embodiment of the present invention.

FIG. 4A shows the RF probe according to another embodiment of the present invention. In this embodiment the same pickup coils 7, 7' as the pickup coils explained with reference to FIG. 2 are disposed at positions deviated by 90° round the center axis of the resonator 6.

Figure 4B:
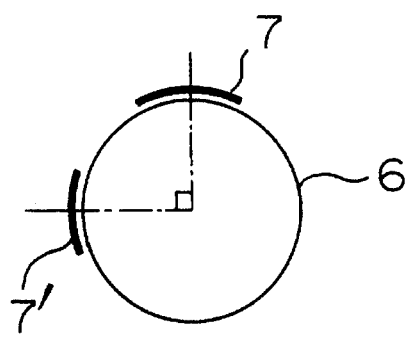
FIG. 4B is a view when taken along an arrow A in FIG. 4A.

FIG. 4B is a view when FIG. 4A is viewed from the side of an arrow A, and illustrates the positional relationship between the PUC 7 and 7'. These PUC 7 and 7' are disposed along the conductor loops and in the proximity therewith.

When the RF signal is simultaneously received by the PUC 7, 7' having such a structure and are synthesized, a quadrature reception coil can be accomplished and a higher sensitivity of the cross system can be attained.

Figure 1A:
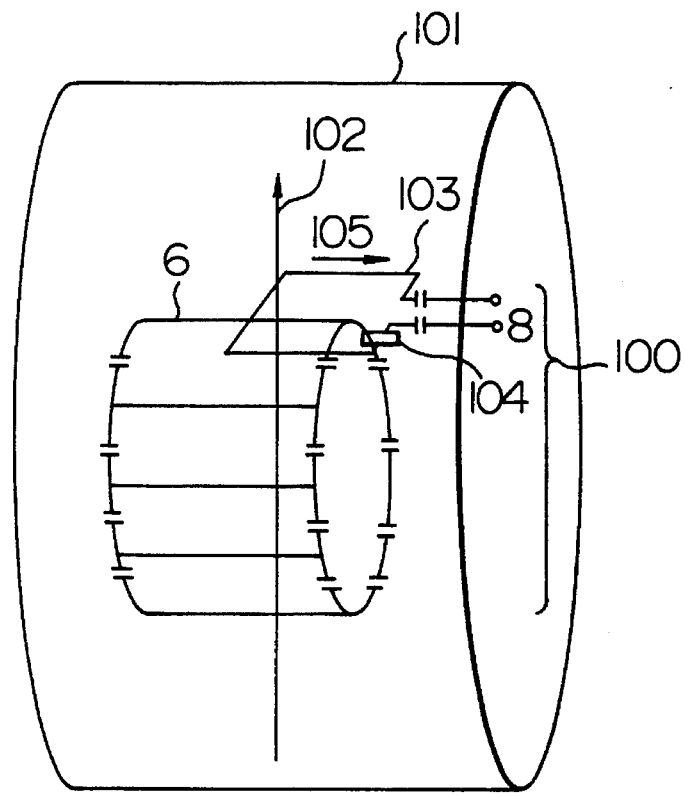
FIG. 1A is a perspective view showing an RF probe of a cross system as an RF transmission/reception system for MRI according to the prior art.
Figure 1B:
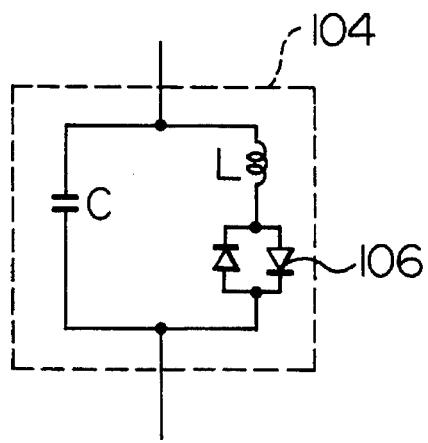
FIG. 1B is a circuit diagram showing an example of decoupling device.
Figure 5:
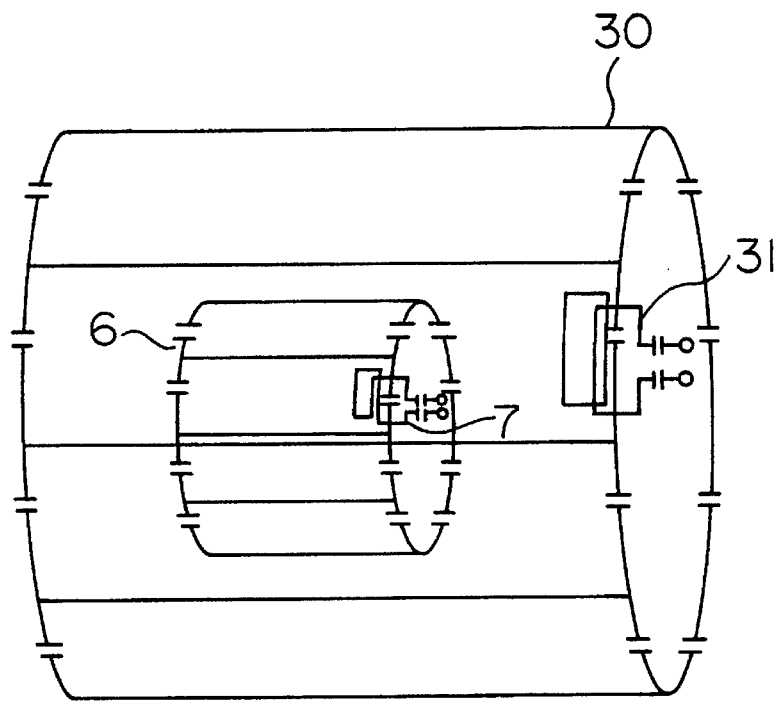
FIG. 5 is a perspective view showing the RF probe according to still another embodiment of the present invention.

FIG. 5 shows the RF probe according to still another embodiment of the present invention. In this embodiment, a pickup coil 31 similar to the pickup coil explained with reference to FIG. 2 is disposed in such a manner as to extend along, and in the vicinity of, a conductor loop of a transmission coil 30. The reception coil has a structure similar to that of the coil shown in FIG. 2. In this case, the reception coil 100 having a known structure such as the one shown in FIG. 1 can be used as the reception coil.

The construction shown in FIG. 4A can also be applied to the transmission coil, too. In other words, two B-shaped pickup coils can be disposed at different positions deviated from each other by 90°.

When the present invention is applied to the transmission coil, it becomes possible to obtain the effect that magnetic coupling between the pickup coil and an RF shield disposed in the vicinity of the transmission coil can be reduced.

Figure 6:
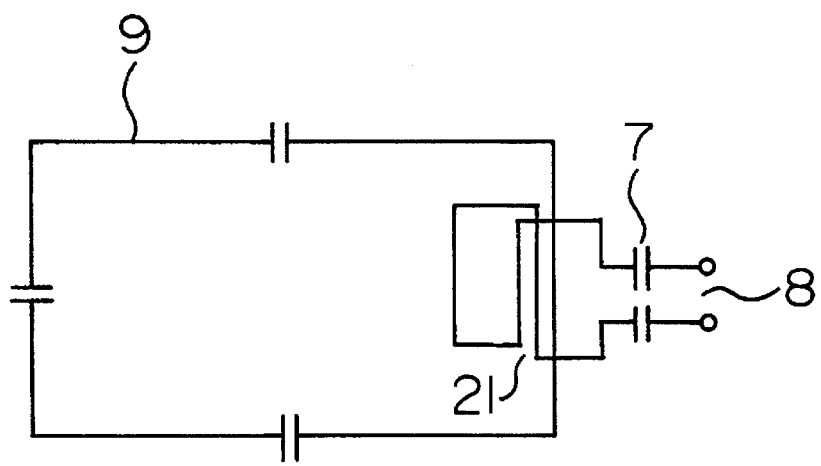
FIG. 6 is a circuit diagram showing the RF probe according to still another embodiment of the present invention.

FIG. 6 shows still another embodiment wherein the present invention is applied to a rectangular surface coil 9. The surface coil is one of the forms of the resonator. In this embodiment, a part of the conductor loop constituting the surface coil and the parallel portion 21 at the center of the 8-shaped pickup coil 7 are so disposed as to extend along, and in the vicinity of, the conductor loop. Besides the effects of each of the foregoing embodiments, this embodiment provides the effect that electromagnetic induction to the coil and the cable at the time of RF transmission becomes smaller than in the capacitance coupling type surface coil ordinarily used because the coil is kept under a complete floating state from the detection cable. Accordingly, the antenna effect of the surface coil can be reduced, and accidents such as burn of a patient when coming into contact with the cable, etc., can be avoided. The surface coil of this embodiment may have a round shape or other shapes.

Figure 7:
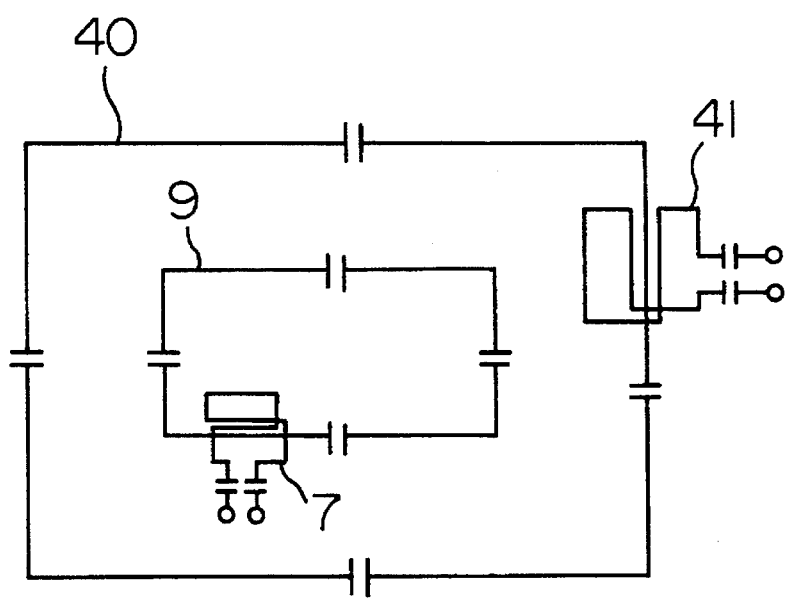
FIG. 7 is a circuit diagram showing the RF probe according to still another embodiment of the present invention.

FIG. 7 shows still another embodiment wherein the present invention is applied to a surface coil as the transmission coil. A pickup coil 41 similar to the pickup coil explained with reference to FIG. 2 is disposed as the transmission coil 40 in the same way as in FIG. 6. The reception coil is the same as the coil shown in FIG. 6. In this case a heretofore known coil can be used as the reception coil.

The present invention can be applied to any transmission coils and is not particularly limited to the coils described in the foregoing embodiments. A saddle coil, an STR, an MER, a surface coil, etc. can be utilized as the transmission coil.

Besides the probe described in the foregoing embodiments, the present invention can likewise be applied to a probe for the full body, a probe for the knee and a probe for a local part, such as an array coil.

We claim:

1. An RF probe comprising:

a resonator; and a first pickup coil disposed in the vicinity of said resonator;

wherein said first pickup coil is connected in inductive coupling with said resonator and said first pickup coil is an 8-shaped coil, and a center portion of said first pickup coil is so disposed as to extend along, and in the vicinity of, a part of a conductor loop of said resonator.

2. An RF probe according to claim 1, which further includes a transmission coil, and wherein said resonator is disposed inside said transmission coil.

3. An RF probe according to claim 2, wherein said transmission coil is a resonator.

4. An RF probe according to claim 1, wherein said resonator is a multiple element resonator.

5. An RF probe according to claim 4, further including a second 8-shaped pickup coil which is connected in inductive coupling with said resonator, and wherein said second 8-shaped pickup coil is disposed at a position different by 90° from said first pickup coil around a center axis of said resonator, and a center portion of said second 8-shaped pickup coil is so disposed as to extend along, and in the vicinity of, a part of said conductor loop of said resonator.

6. An RF probe according to claim 1, wherein said resonator is a loop coil.

7. An RF probe according to claim 6, wherein said loop coil is a round loop coil.

8. An RF probe according to claim 6, wherein said loop coil is a rectangular loop coil.

9. An RF probe according to claim 1, wherein said first pickup coil constitutes an LC series resonance system.

10. An RF probe according to claim 1, wherein said first pickup coil includes a decoupling circuit.

11. An RF probe comprising:

a first resonator;

a second resonator disposed inside said first resonator; and a first pickup coil disposed in the vicinity of said resonator;

wherein said first pickup coil is connected in inductive coupling with said first resonator and said first pickup coil is an 8-shaped coil, and a center portion of said first pickup coil is so disposed as to extend along, and in the vicinity of, a part of a conductor loop of said first resonator.

12. An RF probe according to claim 11, wherein said first resonator is a multiple element resonator.

13. An RF probe according to claim 11, wherein said first pickup coil constitutes an LC series resonance system.

14. An RF probe according to claim 11, wherein said first pickup coil includes a decoupling circuit.

15. An RF probe according to claim 11, further including a second 8-shaped pickup coil which is connected in inductive coupling with said first resonator, and wherein said second 8-shaped pickup coil is disposed at a position different by 90° from said first pickup coil round a center axis of said first resonator, and a center portion of said second 8-shaped pickup coil is so disposed as to extend along, and in the vicinity of, a part of said conductor loop of said first resonator.

* * * * *